United States Patent
Hurwitz et al.

(10) Patent No.: US 9,161,461 B2
(45) Date of Patent: Oct. 13, 2015

(54) MULTILAYER ELECTRONIC STRUCTURE WITH STEPPED HOLES

(75) Inventors: Dror Hurwitz, Zhuhai (CN); Simon Chan, Zhuhai (CN); Alex Huang, Hsin Chu (TW)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 282 days.

(21) Appl. No.: 13/523,116

(22) Filed: Jun. 14, 2012

(65) Prior Publication Data

US 2013/0333934 A1    Dec. 19, 2013

(51) Int. Cl.
| | |
|---|---|
| H05K 1/02 | (2006.01) |
| H05K 3/10 | (2006.01) |
| H05K 3/46 | (2006.01) |
| H01L 23/367 | (2006.01) |
| H01L 23/498 | (2006.01) |
| H01L 21/48 | (2006.01) |

(52) U.S. Cl.
CPC .......... *H05K 3/4697* (2013.01); *H01L 23/3677* (2013.01); *H01L 21/4857* (2013.01); *H01L 23/49822* (2013.01); *H01L 2924/0002* (2013.01); *H05K 2201/096* (2013.01); *H05K 2201/09845* (2013.01); *H05K 2203/308* (2013.01); *Y10T 29/49155* (2015.01)

(58) Field of Classification Search
CPC .................................. H05K 1/02; H05K 3/10
USPC ...................... 174/262, 487; 29/846
See application file for complete search history.

(56) References Cited

U.S. PATENT DOCUMENTS

| | | | |
|---|---|---|---|
| 5,858,816 A * | 1/1999 | Sato et al. ...................... | 438/125 |
| 6,184,463 B1 * | 2/2001 | Panchou et al. ................ | 174/558 |
| 7,635,641 B2 | 12/2009 | Hurwitz et al. | |
| 7,669,320 B2 | 3/2010 | Hurwitz et al. | |
| 7,682,972 B2 | 3/2010 | Hurwitz et al. | |
| 2010/0132994 A1* | 6/2010 | Fillion et al. ................... | 174/261 |
| 2012/0319250 A1* | 12/2012 | Schmitt et al. ................. | 257/632 |
| 2013/0206463 A1* | 8/2013 | Boday et al. ................... | 174/258 |

FOREIGN PATENT DOCUMENTS

| | | | | |
|---|---|---|---|---|
| JP | 11023923 | * | 1/1999 | |
| JP | 2000196237 A | * | 7/2000 | ............... H05K 3/46 |

OTHER PUBLICATIONS

English translation of Abstract for JP02000196237A, pub. Jul. 2000, Inventor: IN.*
English translation of Abstract for JP11023923, pub. Jan. 1999, Invebtor: Miyata.*

* cited by examiner

*Primary Examiner* — Timothy Thompson
*Assistant Examiner* — Charles Pizzuto
(74) *Attorney, Agent, or Firm* — Wiggin and Dana LLP; Gregory S. Rosenblatt; Jonathan D. Hall

(57) ABSTRACT

A multilayer electronic structure comprising a plurality of layers extending in an X-Y plane consisting of a dielectric material surrounding metal via posts that conduct in a Z direction perpendicular to the X-Y plane, wherein at least one multilayered hole crosses at least two layers of the plurality of layers and comprises at least two hole layers in adjacent layers of the multilayer composite electronic structure, wherein the at least two holes in adjacent layers have different dimensions in the X-Y plane, such that a perimeter of the multilayered hole is stepped and where at least one hole is an aperture to a surface of the multilayer electronic structure.

27 Claims, 5 Drawing Sheets

MULTILAYER ELECTRONIC STRUCTURE WITH STEPPED HOLES

BACKGROUND

1. Field of the Disclosure

The present invention is directed to improved interconnect structures, and specifically but not exclusively to improved interconnect structures with stepped holes and to methods for their fabrication.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

Although the range of acceptable sizes and reliability is improving over time, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

The size of laser drilled vias in composite dielectric materials are practically limited to a minimum of about $60 \times 10^{-6}$ m diameter, and even so suffer from significant tapering with depth, as well as rough side walls due to the nature of the composite material drilled, in consequence of the ablation process involved.

In addition to the other limitations of laser drilling as described hereinabove, there is a further limitation of the drill & fill technology in that it is difficult to fabricate different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias. Consequently, in practice, all drill & fill vias in a single layer have nominally the same diameter, albeit affected by ablation and tapering.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover, exposed to create a pattern which is selectively removed to make trenches that expose the seed layer. Via posts are created by depositing copper into the photo-resist trenches. The remaining photo-resist is then removed, the seed layer is etched away, and a dielectric material that is typically a polymer impregnated glass fiber mat, is laminated thereover and therearound to encase the vias posts. Various techniques and processes can then be used to remove part of the dielectric material thereby thinning down and planarizing the structure and exposing the tops of the via posts to allow conductive connection to ground thereby, for building up the next metal layer thereupon. By repeating the process, subsequent layers of metal conductors and via posts may be deposited thereonto to build up a desired multilayer structure.

In an alternative but closely linked technology, known hereinafter as 'panel plating', a continuous layer of metal or alloy is deposited onto a substrate. A layer of photo-resist is deposited on top of the substrate and a pattern is developed therein, and the pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts.

The via layers created by pattern plating or panel plating methodologies described above are typically known as 'via posts' and feature layers from copper.

It will be appreciated that the general thrust of the microelectronic evolution is directed towards fabricating ever smaller, thinner and lighter and more powerful products having high reliability. However, the use of thick, cored interconnects, prevents ultra-thin products being attainable. To create ever higher densities of structures in the interconnect IC substrate or 'interposer', ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

An aspect of the invention is directed to providing a multilayer electronic structure comprising a plurality of layers extending in an X-Y plane, the multilayer electronic structure consisting of a dielectric material surrounding metal via posts that conduct in a Z direction perpendicular to the X-Y plane, wherein at least one multilayered hole crosses at least two layers of the plurality of layers and comprises at least two layers of hole in adjacent layers of the multilayer electronic structure, wherein the at least two layers of hole in adjacent layers have different dimensions in the X-Y plane, such that a perimeter of the multilayered hole is stepped and where at least one layer of hole is an aperture in a surface of the multilayer electronic structure.

In some embodiments, each layer of the at least one mutilayered hole is circular and each layer of hole in a subsequent layer extends less than each layer of hole in a previous layer and the multilayered hole has a generally stepped conical shape.

In some embodiments the at least one mutilayered hole comprises at least three layers of hole.

In some embodiments the at least one multilayered hole comprises at least 4 layers of hole.

In some embodiments the at least one multilayered hole comprises at least 5 layers of hole.

In some embodiments only one hole layer in the at least one mutilayered hole comprises an aperture in a surface of the multilayer support structure, and the multilayered hole is a blind hole.

In some embodiments the multilayered hole comprises hole layers at each end that are apertures in opposite surfaces of the multilayer electronic support structure and the multilayered hole is a through hole.

In some embodiments the at least one multilayered hole comprises an aperture in a first side of the multilayer electronic structure that is at least 30% larger than an aperture in a second side of the multilayer electronic structure.

In some embodiments the at least one multilayered hole crosses at least three layers of the plurality of layers and comprises a stack of three layers of holes, wherein said three holes comprise a inner hole in an inner layer sandwiched between outer holes in outer layers, characterized by the inner hole being smaller that the outer holes.

In some embodiments the at least one multilayered hole crosses at least three layers of the plurality of layers and comprises a stack of at least three layers of holes, wherein said at least three layers of holes comprises at least one inner layer of hole in at least one inner layer of hole sandwiched between outer layers of hole in outer layers, characterized by the at least one inner layer of hole being larger that the outer layers of hole.

In some embodiments a position of the inner layer of hole in an inner layer of the multilayer support structure is aligned with electronic structures in the inner layer of the multilayer electronic support structure.

In some embodiments at least one multilayered hole crosses at least three layers of the plurality of layers and comprises a stack of at least three layers of hole, wherein each subsequent layer of hole in a subsequent layer of the multilayer electronic support structure is larger than a previous layer of hole in a previous layer of the multilayer electronic support structure such that the multilayered hole has a stepped tapering surface.

In some embodiments the layers of hole are circular and the at least one multilayered hole has a stepped conical tapering perimeter.

In some embodiments each layer of hole of the at least one multilayer hole is rectangular and each subsequent layer of hole in a subsequent layer extends in one direction less than a previous layer of hole in a previous layer and the multilayered hole comprises a stepped perimeter in one direction.

In some embodiments each layer of hole of the at least one multilayered hole is rectangular and a layer of hole in a subsequent layer extends in two opposite directions less than a layer of hole in a previous layer and the multilayered hole has a generally trapezoidal shape.

In some embodiments each layer of hole of the at least one multilayered hole is rectangular and each subsequent layer of hole extends in three opposite directions less than each previous layer and the multilayered hole has a generally pyramidal shape with three stepped diagonal walls and one substantially smooth wall perpendicular to at least one of a top and bottom aperture.

In some embodiments each layer of hole of the at least one multilayered hole is rectangular and each subsequent layer of hole extends in four opposite directions less than a layer of hole in a previous layer and the multilayered hole has a generally stepped pyramid shape.

In some embodiments the dielectric material comprises a polymer.

In some embodiments the dielectric material further comprises at least one of the group comprising glass fibers, ceramic particle inclusions and glass particle inclusions.

A second aspect is directed to a method of creating at least one multilayered hole in a multilayer electronic support structure that comprises a plurality of layers extending in an X-Y plane consisting of a dielectric material surrounding metal via posts that conduct in a Z direction perpendicular to the X-Y plane, wherein the at least one multilayered hole crosses at least two layers of the plurality of layers; wherein the method comprises the steps of:
forming a multilayered sacrificial stack comprising a plurality of metal layers selected from metal via layers and metal feature layers wherein the multilayered sacrificial tack is encapsulated in a dielectric material;
exposing an end of the multilayered sacrificial stack and etching away the multilayered sacrificial stack to create the multilayered hole where the exposed end of the multilayered sacrificial stack forms an aperture to the multilayer hole.

In some embodiments, the surface of the multilayer electronic support structure surrounding the exposed end of the multilayered sacrificial stack is masked to protect metal features therein.

In some embodiments, the multilayered sacrificial stack comprises metal via layers and metal feature layers comprising layers of electrodeposited copper and optionally further comprising seed layers of sputtered, PVD deposited or electroless plated copper, and the seed layers optionally further comprise adhesion metal layers selected from the group comprising tantalum, titanium, tungsten and chromium.

In some embodiments the step of etching away comprises applying a liquid etch selected from the group comprising $CuCl_2$ acid and $HNO_3OH$ alkaline standard etching solution at a temperature of between 18° C. and 75° C.

In some embodiments masking ends of surrounding features and vias comprises laying and patterning a photoresist thereover.

In some embodiments a layer of hole of the multilayered hole is alignable to within 20 microns of a feature of interest within the layer of the multilayer electronic support structure.

In some embodiments a layer of hole of the multilayered hole is alignable to within 10 microns of a feature of interest within the layer of the multilayer electronic support structure.

In some embodiments a layer of hole in the multilayered hole is alignable to within 3 microns of a feature of interest within the layer of the multilayer electronic support structure.

The term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that there is no effective upper limit to the in-plane dimensions of a feature.

Figure 1:
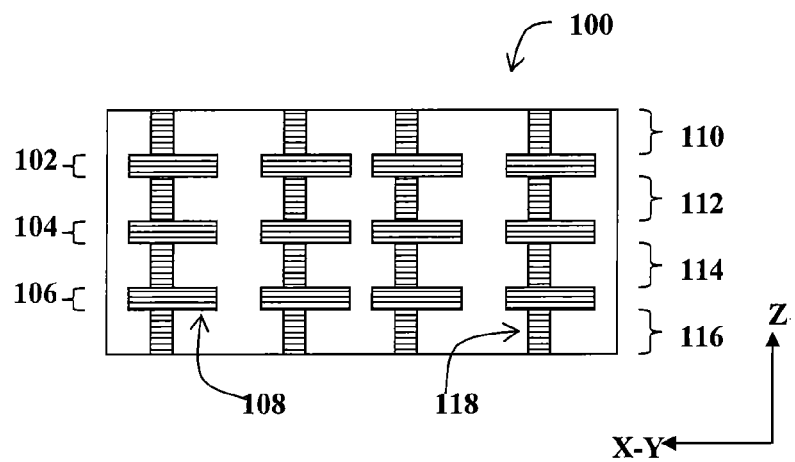
FIG. 1 is a simplified section through a multilayer electronic support structure of the prior art.

FIG. 1 is a simplified section through a multilayer electronic support structure of the prior art. Multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section, as they are fabricated by first drilling a laser hole in the dielectric. Since the dielectric is heterogeneous and anisotropic, and consists of a polymer matrix with inorganic fillers and glass fiber reinforcements, the circular cross-section thereof is typically rough edged and the cross-sections thereof may be slightly distorted from a true circular shape. Furthermore, the vias tend to taper somewhat, being inverse frusto-conical instead of cylindrical.

As described in U.S. Pat. Nos. 7,682,972, 7,669,320 and 7,635,641, for example, the structure of FIG. 1 may alternatively be fabricated by plating in a pattern in a photo-resist (pattern plating), or by panel plating and then selectively etching; either way leaving up standing via posts, and then laminating a dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

Furthermore, it will be noted that laser drilled vias in composite dielectric materials such as polyimide/glass or epoxy/glass or BT (Bismaleimide/Triazine)/glass or their blends with ceramic and/or other filler particles, are practically limited to a minimal size of about $60\times10^{-6}$ m diameter, and even so suffer from significant tapering shape as well as rough side walls due to the nature of the composite material drilled, in consequence of the ablation process involved.

It has been surprisingly found that using the flexibility of the plating and photo-resist techniques, a wide range of via shapes and sizes may be cost-effectively fabricated. Furthermore, different via shapes and sizes may be fabricated in the same layer. The proprietary via post approach developed by AMITEC, enables 'conductor via' structures that utilize the large dimensions of the via layer to conduct in the x-y plane. This is especially facilitated when the copper pattern plating approach is used, where smooth, straight, non-tapering trenches may be produced in a photo-resist material, and then filled by subsequently depositing copper into these trenches by using a metal seed layer and then filling by pattern plating copper into the trenches. In contrast to the drilled & filled via approach, via post technology enables trenches in a photoresist layer to be filled to obtain dimple-less, dome-less copper connectors. After deposition of the copper the photoresist is subsequent stripped away, the metal seed layer is subsequently removed and a permanent, polymer-glass dielectric is applied thereover and therearound. The 'via conductor' structure thus created may use the process flows described in U.S. Pat. Nos. 7,682,972, 7,669,320 and 7,635,641 to Hurwitz et al.

In general, as shown in FIG. 1, interconnect structures typically comprise alternating via layers and feature layers. Using Amitec's proprietary technology, the via layers may also extend in the X-Y plane and need not be simple cylindrical posts but may have other shapes.

Figure 2:
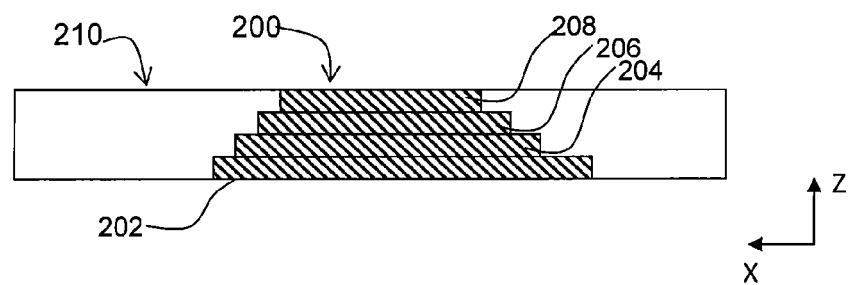
FIG. 2 is a schematic illustration of a cross-section through a trapezoidal shaped sacrificial stack of vias.

With reference to FIG. 2, a section through a tapered stack of via posts 200 is shown. The stack 200 consists of a first layer 202, a second layer 204, a third layer 206 and fourth layer 208 surrounded by a dielectric material 210, without intermediary copper conductors or pads in the X-Y planes.

Since each layer is deposited on a previous layer that is larger, it is possible to fabricate each layer by pattern plating into subsequently deposited layers of photo-resist.

In one example, the bottom layer 202 of the stack 200 may be $320\times10^{-6}$ m by 840 $10^{-6}$ m (i.e. microns or μm). The second layer 204 may be $320\times10^{-6}$ m by $840\times10^{-6}$ m, the third layer 206 may be $220\times10^{-6}$ m by $740\times10^{-6}$ m, and the fourth (top) layer 208 may be $120\times10^{-6}$ m$\times640$ by $10^{-6}$ m. Thus each layer may be 40 to 50 microns wider in all dimensions, than the layer thereabove.

If at least one end of the via stack reaches an external surface of the multilayer electronic support structure, exposure of the stack to an etchant will result in the stack being etched away. It has been found possible to create multilayer shaped holes in this manner.

In FIG. 2, a trapezoidal stepped via stack including 4 layers is shown. The trapezoidal stepped via stack tapers or slopes symmetrically in two directions. However, it will be appreciated that with careful alignment, the stepped via stack may be configured not to slope symmetrically, or to slope in one direction only.

A multilayer hole crosses at least two layers of the plurality of layers of the multilayer electronic interconnect structure and consists of at least two overlapping layers of hole in adjacent layers of the multilayer electronic interconnect structure, having different dimensions in the X-Y plane, such that the multilayer hole tapers. More typically, the multilayer hole comprises at least three layers of hole and may consist of 4 or 5 layers of hole or more.

For creating multilayer holes, the via stack may be used as a sacrificial precursor.

The external surface of the multilayer electronic support structure may be protected with photoresist patterned such that ends of one of more sacrificial stacks may be exposed. Etching with a strong liquid etchant may dissolve away the sacrificial stack, leaving a multilayer hole.

Figure 3:
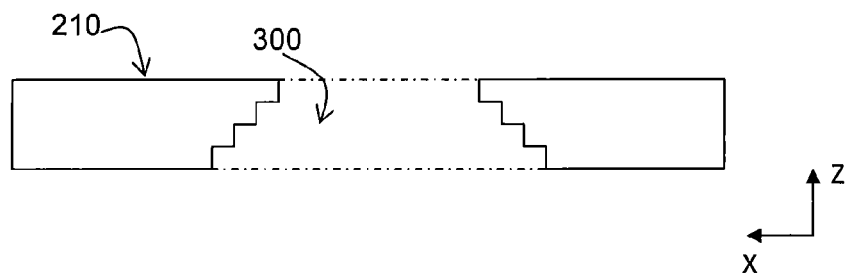
FIG. 3 is a schematic illustration of a cross-section through a trapezoidal shaped multilayer hole formed by dissolving the structure of FIG. 2.

With reference to FIG. 3, a multilayer hole 300 corresponding to multilayer stack 200 of FIG. 2 is shown.

The via stacks described above and generally fabricated from copper. Immersion in a solution of acidic $CuCl_2$ or $HNO_3OH$ alkaline standard etching solution at a temp of between room temperature and about 75° C. enables the copper and adhesion layers to be etched away.

The main reactions of ammoniacal Cu etching solution are as follows:

$$CuCl_2 + 4NH_3 \rightarrow Cu(NH_3)4Cl_2 \qquad [1]$$

$$Cu(NH_3)4Cl + Cu \rightarrow 2Cu(NH_3)2Cl \qquad [2]$$

Preferably the concentrations are $[Cu^{2+}]$:120-126 g/l; $[Cl^-]$:4.5-5.5N

The specific gravity is typically 1.185-1.195 and the pH is generally 8.0-9.0.

Although the reaction will occur from room temperature up to about 75 C., preferably the temperature is controlled in the range of 48° C. to 54° C.

The $CuCl_2$ Cu etching solution:

$$CuCl_2 + Cu \rightarrow 2CuCl \qquad [3]$$

$$4CuCl + 4HCl + O_2 \rightarrow 4CuCl_2 + 2H_2O \qquad [4]$$

$$\text{Regeneration: } 2CuCl + NaClO + 2HCl \rightarrow 2CuCl_2 + NaCl + H_2O \text{ or} \qquad [5]$$

$$4CuCl + 4HCl + O_2 \rightarrow CuCl_2 + H2O \qquad [6]$$

Concentration: $[Cu^{2+}]$:120-126 g/l; acidity: 1.5-2.5N; Specific gravity: 1.28-1.295

Although the reaction will occur from room temperature up to about 75 C., preferably the temperature is controlled in the range of 48° C. to 52° C.

Cu Micro-etch solution:
Main composition/reaction:

$$Cu + H_2O_2 + 2H+ \rightarrow Cu_2 + + 2H_2O \qquad [7]$$

$$2H_2O_2 \rightarrow 2H_2O + O_2 \qquad [8]$$

Concentration: $H_2SO_4$:20-50 g/l; $H_2O_2$:6-12 g/l; $[Cu^{2+}]$:5-30 g/l

Although the reaction will occur from room temperature up to about 75 C., preferably the temperature is controlled in the range of 26-34° C.

Figure 4:
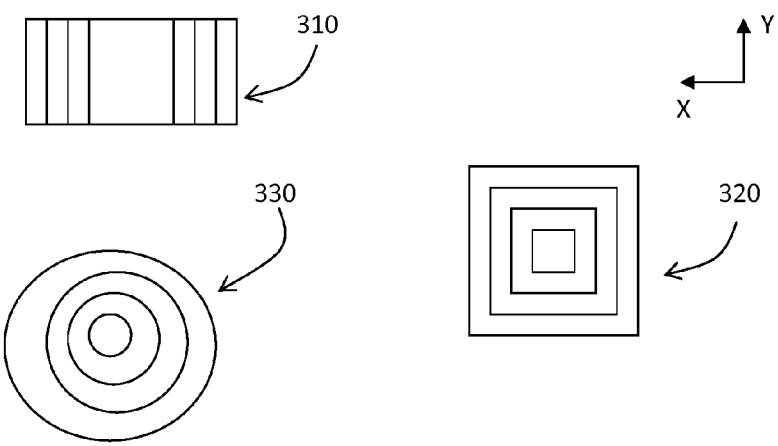
FIG. 4 shows trapezoidal, pyramidal and conical multilayer holes from above.

With reference to FIG. 4, from below, the multilayered hole of FIG. 3 may be a rectangular stepped hole 310 that may slope in two directions. Alternatively, the multilayered hole 320 may be square and may slope in 4 directions providing a pyramid shaped hole. Although not shown, it will be appreciated, that by laying each subsequent layer asymmetrically, the stacks sloping in one or three dimensions may be fabricated.

Furthermore, a conical multilayered hole 330 may comprise circular holes. Depending on the diameter of each hole and the accuracy of their alignment, the multilayered hole may be regular or irregular.

In addition to the flexibility of being able to provide multilayered stepped holes of any shape, and sizes from 30 microns upwards, there is a further advantage in that the position of each layer of hole depends on the position of the layers of metal of the sacrificial stack first fabricated which are themselves co-fabricated with functional elements in the same layer of the electronic multilayer support structure.

Laser or mechanical drilling can only align with external features and mechanical drilling can currently only achieve precision of placement to within +/−50 μm of the desired location. Currently, laser drilling is more accurate than mechanical drilling, with accuracies of +/−20 μm being attainable. Electroplating and etching in accordance with embodiments of the present invention is more accurate, with +/−3 μm being attainable. By etching a stepped, tapering hole the desired dimension shape may be fabricated only in the last layer where the alignment to the photolithography features is almost perfect.

Thus round holes, slots, and other shaped holes may be fabricated by etching, and accurately positioned where desired.

Each layer of the multilayered hole may be rectangular and each subsequent layer of hole may extend in one direction less than each previous layer of hole and the multilayered hole may have a stepped structure in one direction. In other embodiments, each layer of hole of the multilayered hole may be rectangular and each subsequent layer of hole may extend in two opposite directions less than each previous layer and the multilayered hole may have a generally trapezoidal shape.

In yet other embodiments, each layer of hole of the multilayered hole may be square or rectangular, and each subsequent layer of hole may extends in three opposite directions less than each previous layer of hole and the multilayered hole may have a generally pyramidal shape with three stepped diagonal side faces and one substantially smooth side face perpendicular to a top and bottom layer.

In yet other embodiments, each layer of hole of the multilayered hole may be rectangular and each subsequent layer of hole may extends in four opposite directions less than each previous layer of hole and the multilayered hole may have a generally stepped pyramid shape.

In some embodiments, each layer of hole is circular and each subsequent layer of hole extends less than each previous layer and the multilayer hole has a generally stepped conical shape.

Although the upright pyramid shaped sacrificial stack 200 of FIG. 2 comprises layers of metal laid down over more extensive layers, in surrounding areas of an interconnect structure it may be necessary to lay down features onto dielectric. Thus to enable fabrication of a sacrificial tapering via stack in a multilayer electronic interconnect support structure, the via layers may be interspersed with features layers or pads. Such features layers or pads typically consist of a seed layer which may be copper, and may be fabricated by sputtering, by electroless plating of by physical vapor deposition PVD, to adhere to underlying dielectric. The seed layer may be 0.5 to 1.5 microns thick. Over the seed layer, a thick layer of metal, typically copper, may be pattern or panel plated. To further aid adherence of the seed layer to the underlying dielectric, a very thin layer, typically 0.04 microns to 0.1 microns of an adhesion metal, such as titanium, tantalum, tungsten, chromium or mixtures thereof, may first be applied.

In some embodiments, a bottom layer in the stack is at least 30% larger than a top layer.

Figure 5:
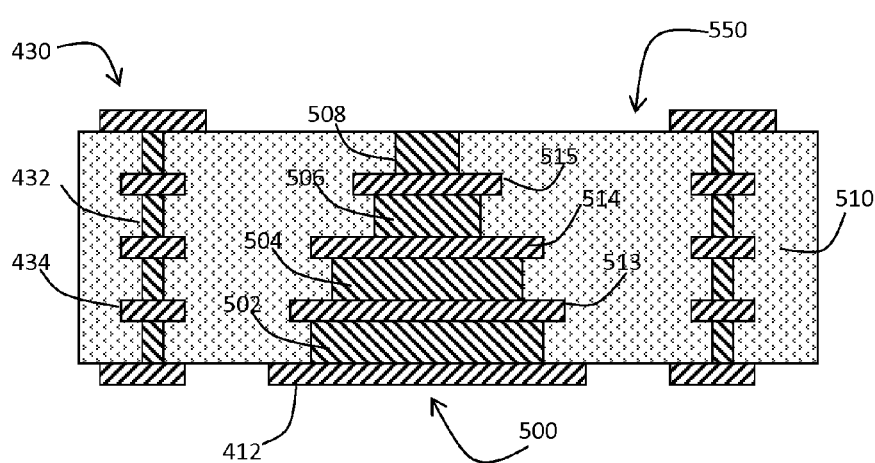
FIG. 5 is a cross section through a trapezoidal stack of via and feature layers.

With reference to FIG. 5, a section of an interconnect structure 550 including a stack 500 of copper via posts and feature layers having a stepped profile is shown. The stack 500 is surrounded by dielectric material 510. The stack 500 consists of four via layers of copper; a first via layer 502, a second via layer 504, a third via layer 506, and fourth via layer 508, surrounded by a dielectric material 510. The layers 502, 504, 506, 508 may be geometrically separated from each other but electronically coupled together by copper conductors or pads in the X-Y planes 513, 514 and 515. These pads 513, 514 and 515 are parts of feature layers that will typically include surrounding features (e.g. 434 separated by via posts 432 to form additional surrounding structures 430) in other parts of the interconnect structure. To enable the features to be laid down on top of dielectric, to create the noses of the steps shown, but more significantly, to create surrounding features 434, pads 513, 514 and 515 generally include a seed layer of copper that may be sputtered or electroless plated, and may be 0.5 microns to 1.5 microns thick. Onto the seed layer, additional thickness may be built up using electroplating. To further aid adhesion to the dielectric, a very thin layer of an adhesion metal, such as titanium, tantalum, chromium, tungsten or mixtures thereof may be first deposited. The thin adhesion metal layer is typically 0.04 microns to 0.1 microns thick.

Figure 6:
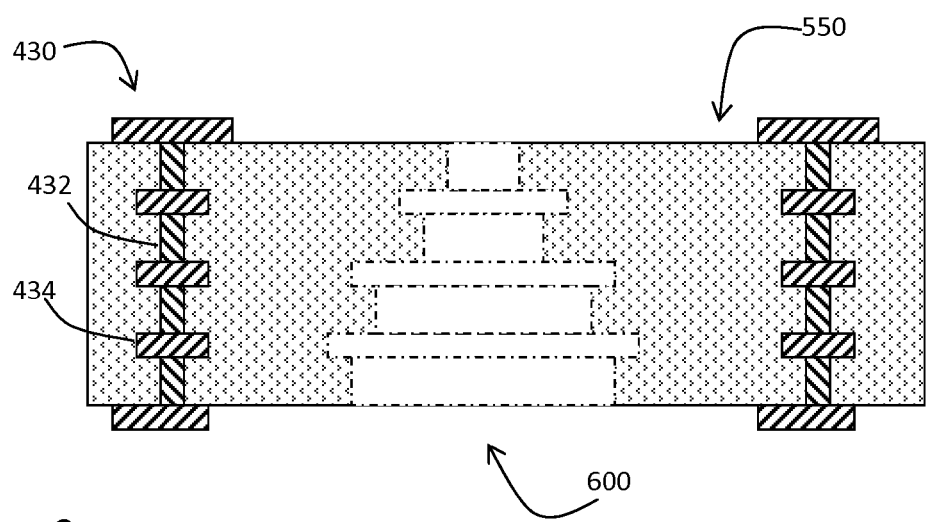
FIG. 6 is a cross section through a resultant multilayer hole created by etching away the trapezoidal stack of via and feature layers of FIG. 5.

After shielding surrounding elements, and exposing to an appropriate etchant, the stack 500 of copper via posts and feature layers may be dissolved, leaving a corresponding multilayered hole 600 as shown in FIG. 6. The substrate 550 may include surrounding structures 430 comprising via posts 432 and feature layers 434.

It has thus been found that using AMITEC technology as described in U.S. Pat. Nos. 7,682,972, 7,669,320 and 7,635,641 to Hurwitz et al., incorporated herein by reference in their entirety, it is possible to create sacrificial structures having variable cross-section profiles, such as trapezoidal, pyramidal, conical, and triangular profiles that may slope in one or two directions. On exposing to an appropriate etchant, the sacrificial structure may be dissolved away, leaving a corresponding multilayer hole whose side wall(s) may slope in one or two directions.

It will further be appreciated that where using seed layers to fabricate the sacrificial stack, not only may tapering multilayer holes be fabricated where each subsequently laid down layer is smaller than the previous, but, due to the seed layer enabling a feature in one layer to protrude more than features in underlying layers, sacrificial stacks that are wider in the middle (convex) or narrower in the middle (concave) may be fabricated. The sacrificial stacks, and on dissolving them, the resultant multilayer holes, may bow in one direction with the opposite wall being flat, in two directions, or in three or four directions.

In some embodiments, layers of hole in previous layers of the multilayered hole extend less in the X-Y plane than the extent of layers of hole in subsequent layers of the multilayer support structure and the multilayered hole has a generally inverse pyramidal shape.

In some embodiments, the multilayered hole in the multilayer electronic support structure comprises more than three layers; at least one inner layer extends further than adjacent outer layers on at least one side, and the multilayered hole has an outwardly bowing profile on said at least one side.

In some embodiments, the multilayered hole in the multilayer electronic electronic structure comprises more than three layers, wherein at least one inner layer of hole extends less than adjacent outer layers of hole on at least one side, and the multilayered hole has an inwardly bowing profile on said at least one side.

Once a multilayer stepped sacrificial stack has been fabricated, as long as one end of the sacrificial stack is exposed on the top or bottom layer of the multilayer structure, a photoresist layer can be used to mask out certain areas in the substrates external layers, allowing the exposed sacrificial multilayer stepped stack to be etched away using an appropriate liquid chemical solutions to generate through structures or even blind holes, that may be but are not required to be circular. These holes may serve as precision through mechanical and optical vias that may be perfectly aligned to the metal features on the external layers of the said substrate. Using a tapering structure, misalignment between the layers of hole may be largely overcome since the smallest etched hole dictates the diameter of the desired through etched structure and will be perfectly aligned to the metal features within its layer.

In some embodiments, the multilayered hole of FIG. 6 may be fabricated by creating a multilayer structure such as that of FIG. 5 and then selectively dissolving the multilayered structure. In general, the multilayered structure comprises alternate layers of pads laid down in feature layers within the multilayered electronic support structure, and via post layers laid down on top of the pads. The via post layers may have the same dimensions or be narrower than the pads, and may be carefully aligned therewith. Alternatively, the via posts may be narrower than the underlying pads. The relative heights of the pads and via posts may be very different, with the pads being narrower, or they may be somewhat similar, or indeed, may have the same height.

Figure 7:
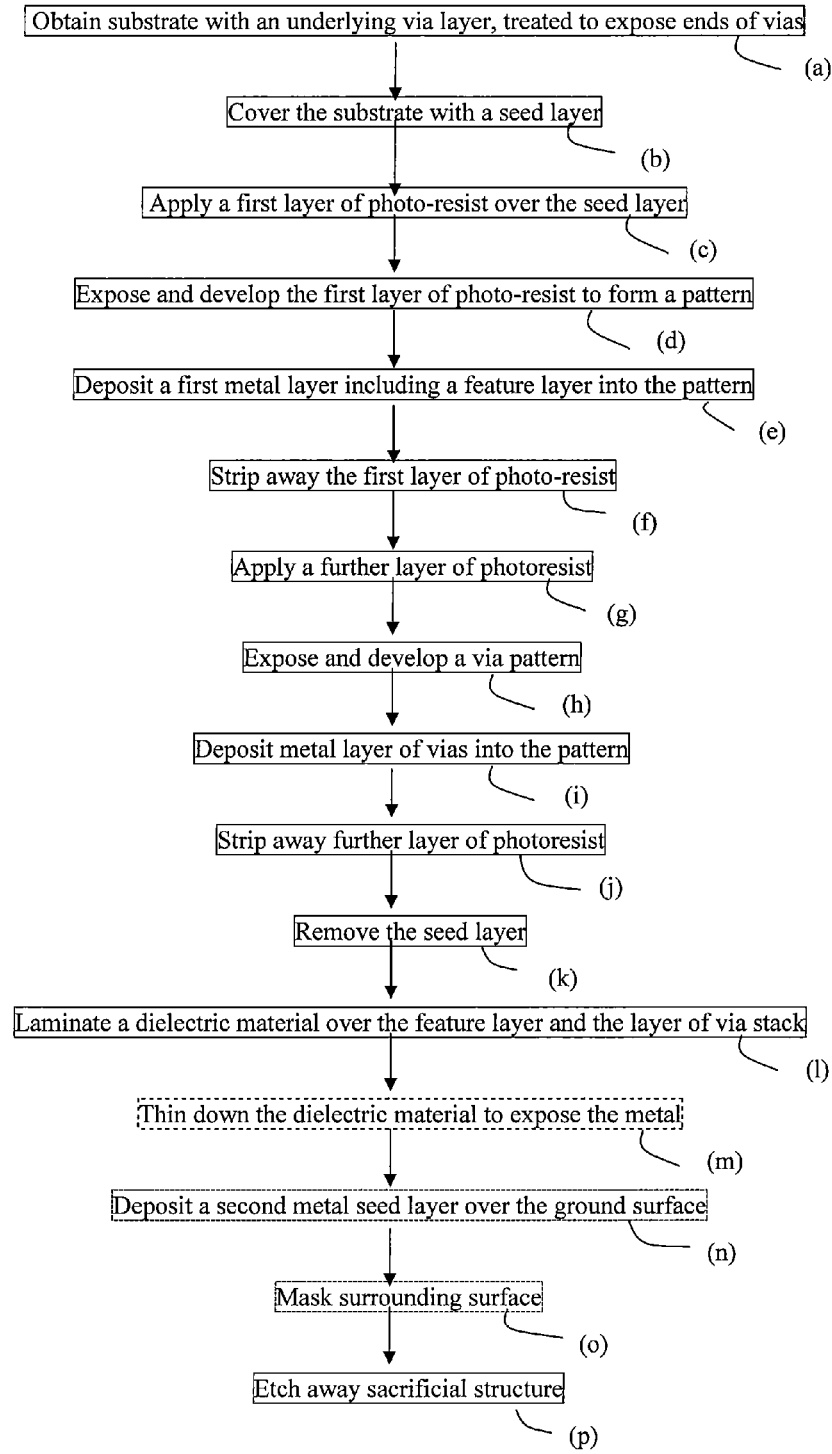
FIG. 7 is a flowchart illustrating one process for fabricating a double layer comprising a pad layer and via post layer, and creating a double layer hole therein.

With reference to FIG. 7, a double layer comprising a pad layer and via post layer may be fabricated by the steps of: obtaining a substrate including an underlying via layer that is treated to expose the copper thereof—step (a), and covering the substrate with a seed layer—step (b), typically copper and typically by sputtering or by electroless plating. Optionally, a very thin, perhaps 0.04 to 0.1 micron layer of an adhesion metal, such as tantalum, titanium, chromium or tungsten is first deposited before the copper is deposited thereover. A first layer of photoresist is then applied over the seed layer—step (c), and exposed and developed to form a negative pattern—step (d). A metal layer, typically copper, is electroplated into the negative pattern—step (e), and the photoresist is stripped away—step (f), leaving a first layer of pads upstanding. A second layer of photoresist may now be applied over the pads—step (g), and a pattern of a second via layer may be exposed and developed in the second layer of photoresist—step (h). A second via layer of metal may be deposited into the trenches of the second pattern, either by electroplating or electroless plating to create a via layer—step (i), and the second layer of photoresist may be stripped away—step (j), leaving a stack of two layers, a feature or pad layer followed by a via layer, one on top of the other.

The seed layer is then removed—step (k). Optionally, it is etched away with a wet etch of ammonium hydroxide or copper chloride, for example, and a dielectric material is laminated (l) over the upstanding copper of the pad and via layers.

To enable further build up of additional layers, the dielectric material may be thinned to expose the metal, by mechanical, chemical or mechanical-chemical grinding or polishing which also planarizes the top surface—step (m). Then a metal seed layer, such as copper, may be deposited over the ground surface—step (n), to enable further layers to be built up, by repeating steps (c) to (n).

The dielectric material is generally a composite material comprising a polymer matrix, such as polyimide, epoxy, Bismaleimide, Triazine and blends thereof, and may further glass fibers and ceramic particle fillers, and is generally applied as a pre-preg consisting of woven glass fibers in a polymer resin.

Adjacent layers of the stack may be more or less extensive, providing a stepped stack which may be pyramidal, inverted pyramidal, outwardly or inwardly bowed, with layers having straight or curved edges.

Once formed, the surrounding surface of the substrate is masked—step (o) and the stepped stack structure is dissolved away with an appropriate wet etch—step (p), thereby providing a multilayer hole.

The dielectric material is generally a composite material comprising a polymer matrix, such as polyimide, epoxy, Bismaleimide, Triazine and blends thereof, and may further glass fibers and ceramic particle fillers, and is generally applied as a pre-preg consisting of woven glass fibers in a polymer resin.

Figure 8:
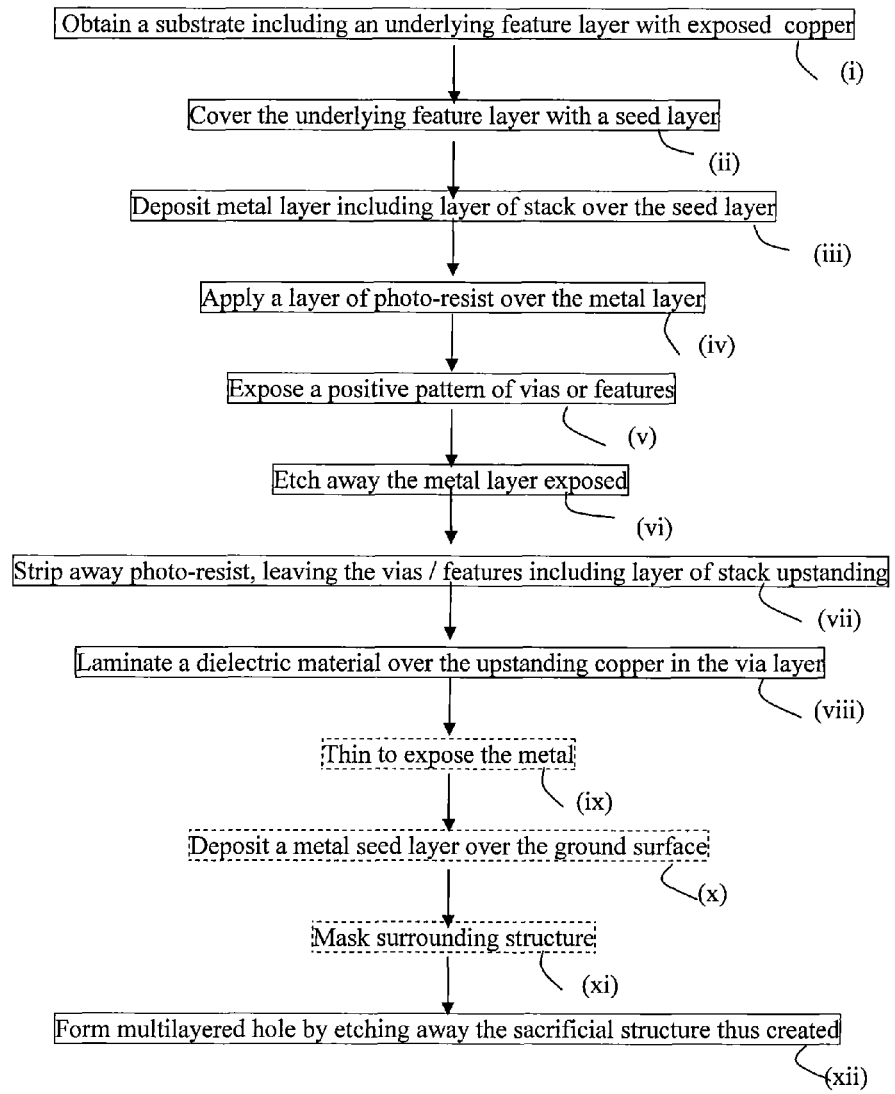
FIG. 8 is a flowchart illustrating an alternative process for fabricating a via post layer with a via hole therein.

Referring to FIG. 8, in a variant fabrication route, the at least one via layer may be fabricated by the steps of: obtaining a substrate including an underlying feature layer that is polished to expose the copper thereof—step (i); covering the underlying feature layer with a seed layer—step (ii); depositing a metal layer over the seed layer—step (iii); applying a layer of photoresist over the metal layer—step (iv); exposing a positive pattern of vias or features including the appropriately dimensioned layer of the contoured stack—step (v), and etching away the metal layer exposed—step (vi). A wet etch, such as a solution of ammonium hydroxide at an elevated temperature, may be used. The photoresist is then stripped away, leaving the vias/features including the layer of the stack upstanding—step (vii), and a dielectric material is laminated over the vias/features including the layer of the stack (viii).

To enable further build up, the dielectric layer may be thinned to expose the metal—step (ix). Then a metal seed layer, such as copper, may be deposited over the thinned surface—step (x).

Steps (i) to (x) may be repeated to lay down further layers. The pattern plating process route of FIG. 7 may be combined with or alternated with the panel plating process route of FIG. 8 with different layers laid down with different processes.

Once formed, the surrounding surface of the substrate is masked—step (xi) and the stepped stack structure is dissolved away with an appropriate wet etch—step (xii), thereby providing a multilayered hole.

The pattern plating process route of FIG. 7 may be combined with or alternated with the panel plating process route of FIG. 8 with different layers laid down with different processes.

To create a multilayered hole, once a sacrificial stack is prepared, so long as one end of the contoured or stepped stack structure is exposed and surrounding structure is protected with photoresist, for example, the contoured or stepped sacrificial stack may be etched away, such as by immersing in one of the etchant solutions described hereinabove.

Adjacent layers of the sacrificial stack may be more or less extensive, providing a stepped stack which may be pyramidal, inverted pyramidal, outwardly or inwardly bowed, with layers having straight or curved edges. On etching away, the resulting multilayered hole may likewise be pyramidal, inverted pyramidal, outwardly or inwardly bowed, each layer of the multilayered hole having straight or curved edges.

The above description is provided by way of explanation only. It will be appreciated that the present invention is capable of many variations. Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components

What is claimed is:

1. A multilayer electronic structure comprising a plurality of layers extending in an X-Y plane, the multilayer electronic structure consisting of a dielectric material comprising a polymer surrounding metal via posts that conduct in a Z direction perpendicular to the X-Y plane, and further comprising at least one multilayered hole that crosses at least two layers of the plurality of layers and at least two layers of hole in adjacent layers of the multilayer electronic structure, wherein the at least two layers of hole in adjacent layers have different dimensions in the X-Y plane, and where at least one layer of hole is an aperture in a surface of the multilayer electronic structure and where a perimeter of a hole in an inner layer of the multilayered hole is aligned with the surrounding via posts to a precision of +−10 microns.

2. The multilayer electronic structure of claim 1, wherein each layer of the at least one multilayered hole is circular and each layer of hole in a subsequent layer extends less than each layer of hole in a previous layer and the multilayered hole has a generally stepped conical shape.

3. The multilayer electronic structure of claim 1, wherein the at least one multilayered hole comprises at least three layers of hole.

4. The multilayer electronic structure of claim 1, wherein the at least one multilayered hole comprises an aperture in a surface of the multilayer support structure, and the multilayered hole is a blind hole.

5. The multilayer electronic structure of claim 1, wherein the at least one multilayered hole comprises hole layers at each end that are apertures in opposite surfaces of the multilayer electronic support structure and the multilayered hole is a through hole.

6. The multilayer electronic structure of claim 1, wherein the at least one multilayered hole comprises an aperture in a first side of the multilayer electronic structure that is at least 30% larger than an aperture in a second side of the multilayer electronic structure.

7. The multilayer electronic structure of claim 1, wherein the at least one multilayered hole crosses at least three layers of the plurality of layers and comprises a stack of three layers of holes, wherein said three holes comprise a inner hole in an inner layer sandwiched between outer holes in outer layers, characterized by the inner hole being smaller that the outer holes.

8. The multilayer electronic structure of claim 1, wherein the at least one multilayered hole crosses at least three layers of the plurality of layers and comprises a stack of at least three layers of holes, wherein said at least three layers of holes comprise at least one inner layers of hole in at least one inner layer of hole sandwiched between outer layers of hole in outer layers, characterized by the at least one inner layer of hole being larger that the outer layers of hole.

9. The multilayer electronic structure of claim 1, wherein at least one multilayered hole crosses at least three layers of the plurality of layers and comprises a stack of at least three layers of hole, wherein each subsequent layer of hole in a subsequent layer of the multilayer electronic support structure is larger than a previous hole in a previous layer of the multilayer electronic support structure such that the multilayered hole has a stepped tapering surface.

10. The multilayer electronic structure of claim 1, wherein the layers of hole are circular and the at least one multilayered hole has a stepped conical tapering perimeter.

11. The multilayer electronic structure of claim 1, wherein each layer of hole of the at least one multilayer hole is rectangular and each subsequent layer of hole in a subsequent layer extends in one direction less than a previous layer of hole in a previous layer and the multilayered hole comprises a stepped perimeter in one direction.

12. The multilayer electronic structure of claim 1, wherein each layer of hole of the at least one multilayered hole is rectangular and a layer of hole in a subsequent layer extends in two opposite directions less than a layer of hole in a previous layer and the multilayered hole has a generally trapezoidal shape.

13. The multilayer electronic structure of claim 1, wherein each layer of hole of the at least one multilayered hole is rectangular and each subsequent layer of hole extends in three opposite directions less than each previous layer and the multilayered hole has a generally pyramidal shape with three stepped diagonal walls and one substantially smooth wall perpendicular to at least one of a top and bottom aperture.

14. The multilayer electronic structure of claim 1, wherein each layer of hole of the at least one multilayered hole is rectangular and each subsequent layer of hole extends in four opposite directions less than a layer of hole in a previous layer and the multilayered hole has a generally stepped pyramid shape.

15. The multilayer electronic structure of claim 1, wherein the dielectric material further comprises at least one of the group comprising glass fibers, ceramic particle inclusions and glass particle inclusions.

16. The structure of claim 1, wherein at least some of said via posts are stacked via posts traversing the plurality of dielectric layers and comprising electroplated copper via posts interspersed with perpendicular seed layers of sputtered, PVD deposited or electroless plated copper.

17. The structure of claim 16, wherein the seed layers optionally further comprise adhesion metal layers selected from the group comprising tantalum, titanium, tungsten and chromium.

18. The structure of claim 1, such that a perimeter of the multilayered hole is surrounded by a dielectric material without intermediary copper conductors or pads in the X-Y planes.

19. The structure of claim 1 wherein the largest dimensions of the hole are $320 \times 10^{-6}$ m by $840 \ 10^{-6}$ m.

20. The structure of claim 1 wherein a hole layer may be 40 to 50 microns wider in all dimensions, than an adjacent hole layer thereabove.

21. A process for fabricating the multilayer electronic structure of claim 1, comprising the steps of:
    forming a multilayered sacrificial stack comprising a plurality of metal layers selected from metal via layers and metal feature layers wherein the multilayered sacrificial stack is encapsulated in the dielectric material;
    exposing an end of the multilayered sacrificial stack; and
    etching away the multilayered sacrificial stack to create the multilayered hole where the exposed end of the multilayered sacrificial stack forms the aperture to the multilayer hole.

22. The process of claim 21 wherein a surface of the multilayer electronic support structure surrounding the exposed end of the multilayered sacrificial stack is masked to protect metal features therein.

23. The process of claim 21 wherein the multilayered sacrificial stack comprises metal via layers and metal feature layers comprising layers of electrodeposited copper and optionally further comprising seed layers of sputtered, PVD deposited or electroless plated copper.

24. The process of claim 21, wherein the seed layers optionally further comprise adhesion metal layers selected from the group comprising tantalum, titanium, tungsten and chromium.

25. The process of claim 21, wherein the step of etching away comprises applying a liquid etch selected from the group comprising $CuCl_2$ acid and HNO3OH alkaline standard etching solution at a temperature of between 18° C. and 75° C.

26. The process of claim 21, wherein masking ends of surrounding features and vias comprises laying and patterning a photoresist thereover.

27. The process of claim 21, wherein a layer of hole is alignable to within 3 microns of a feature of interest within the layer of the multilayer electronic support structure.

* * * * *